(12) United States Patent
Lee

(10) Patent No.: US 7,039,124 B2
(45) Date of Patent: May 2, 2006

(54) APPARATUS AND METHOD FOR COMPENSATING FOR ANALOG QUADRATURE MODULATION ERROR

(75) Inventor: Seung-Hwan Lee, Seoul (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 10/977,498

(22) Filed: Nov. 1, 2004

(65) Prior Publication Data
US 2005/0129141 A1    Jun. 16, 2005

(30) Foreign Application Priority Data
Oct. 31, 2003    (KR)    ...................... 10-2003-0076675

(51) Int. Cl.
*H04L 25/03* (2006.01)

(52) U.S. Cl. .................. 375/296; 375/285; 455/63; 455/115; 330/11; 330/259; 330/290

(58) Field of Classification Search ............... 375/285, 375/295, 296, 297, 298, 261, 268; 455/63, 455/91, 108, 110, 115; 330/1 R, 1 A, 3, 330/11, 254, 259, 270, 275, 284, 290, 149
See application file for complete search history.

(56) References Cited

U.S. PATENT DOCUMENTS

| 5,929,704 A  * | 7/1999 | Proctor et al. ............... 330/149 |
| 6,429,738 B1 * | 8/2002 | Kenington ................... 330/52 |
| 6,885,242 B1 * | 4/2005 | Leffel et al. ................. 330/149 |

* cited by examiner

*Primary Examiner*—Dac V. Ha
(74) *Attorney, Agent, or Firm*—Roylance, Abrams, Berdo & Goodman, L.L.P.

(57) ABSTRACT

An apparatus and method for compensating for an analog quadrature modulation (AQM) error in a linearization apparatus for AQM-modulating a digital predistorted signal and outputting the AQM-modulated signal through a high-power amplifier. In the apparatus and method, a gain/phase error estimator predicts a gain/phase imbalance error caused by AQM on the predistorted signal. A Direct Current (DC) offset estimator predicts a DC offset for a feedback signal from the high-power amplifier. An error compensator compensates for the digital predistorted signal for a DC offset signal output from the DC offset estimator, and then compensates for a gain/phase error output from the gain/phase error estimator.

20 Claims, 5 Drawing Sheets

APPARATUS AND METHOD FOR COMPENSATING FOR ANALOG QUADRATURE MODULATION ERROR

PRIORITY

This application claims the benefit under 35 U.S.C. § 119(a) of an application entitled "Apparatus and Method for Compensating for Analog Quadrature Modulation Error" filed in the Korean Intellectual Property Office on Oct. 31, 2003 and assigned Serial No. 2003-76675, the entire contents of which are incorporated herein by reference.

BACKGROUND OF THE INVENTION

1. Field of the Invention

The present invention relates generally to an analog quadrature modulation (AQM) apparatus and method in a base station transmitter of a wireless mobile communication system. In particular, the present invention relates to an AQM error compensation apparatus and method for compensating for an error in an AQM output signal.

2. Description of the Related Art

For the effective use of frequency resources increasingly exhausted in a wireless mobile communication environment, linear modulation such as M-ary Phase Shift Keying (M-PSK) and M-ary Quadrature Amplitude Modulation (M-QAM) is needed to increase frequency efficiency (or spectral efficiency).

Generally, a high-power amplifier serves as an important part of amplifying a radio frequency (RF) signal and transmitting the amplified RF signal to a base station over the air, and has a large influence on the non-linearity of the entire system.

To improve the non-linearity characteristic of the power amplifier, there have been proposed a feed forward technique, an envelop feedback technique, and a predistortion technique. Among such linearization techniques, the predistortion technique is the most inexpensive due to its performance and operation at a wider bandwidth.

The predistortion technique pre-distorts an input signal in opposition to the non-linearity characteristic of a power amplifier, and provides the predistorted signal to the high-power amplifier, thereby improving linearity. The predistortion technique, which can be implemented at a baseband, can improve the size and efficiency of the entire system.

In implementing such a linearization apparatus, an analog quadrature modulation (AQM) unit up-converts I and Q signals acquired through a predistortion unit, a digital-to-analog converter (DAC) and a low-pass filter (LPF) into a radio frequency (RF) signal or an intermediate frequency (IF) signal. However, an output signal of the AQM unit has a gain/phase imbalance and a Direct Current (DC)-offset error. For this reason, digital predistortion cannot show a linearization function of the high-power amplifier, so that a transmission stage cannot satisfy a spectral emission standard and a reception stage causes an increase in the bit error rate (BER), thereby resulting in performance degradation of the entire system.

Therefore, various techniques for effectively compensating for an AQM error in implementing the linearization apparatus have been proposed.

In particular, James K. Cavers has proposed an AQM error compensation technique that uses a transmission signal of an intact transmission stage instead of using a particular test signal. A block diagram of a linearization apparatus including the AQM error compensation apparatus proposed by James K. Cavers will be described with reference to FIG. 1.

Referring to FIG. 1, the linearization apparatus includes a digital predistortion (DPD) unit 110, an error compensator 120, first and second digital-to-analog converters (DACs) 130 and 135, first and second low-pass filters (LPFs) 140 and 145, an analog quadrature modulation (AQM) unit 150, a band-pass filter (BPF) 160, a high-power amplifier (HPA) 170, an envelope detector 180, an analog-to-digital converter (ADC) 185, and an error estimator 190. The digital predistortion unit 110 predistorts an input signal such that it has a characteristic opposite to a non-linear distortion characteristic of a digital input signal. The error compensator 120 receives digital I/Q signals output from the digital predistortion unit 110 and compensates for AQM error signals in the received digital I/Q signals. The first and second digital-to-analog converters 130 and 135 convert the digital I/Q signals from the error compensator 120 into analog I/Q signals, respectively. The first and second low-pass filters 140 and 145 low-pass-filter the analog I/Q signals output from the first and second digital-to-analog converters 130 and 135, respectively. The analog quadrature modulation unit 150 modulates the analog I/Q signals output from the first and second low-pass filters 140 and 145 with a carrier frequency. The band-pass filter 160 band-pass-filters the output signals of the analog quadrature modulation unit 150. The high-power amplifier 170 amplifies a signal output from the band-pass filter 160. The envelope detector 180 is located in a feedback path of the signal output from the band-pass filter 160. The analog-to-digital converter 185 digital-converts the analog signal from the analog quadrature modulation unit 150, output from the envelope detector 180, and outputs sample values. The error estimator 190 extracts a gain/phase imbalance and a DC-offset error of the samples output from the analog-to-digital converter 185 using reference I/Q signals received from the predistortion unit 110, and applies the extracted gain/phase imbalance and DC-offset error to the error compensator 120.

The structure of FIG. 1 simultaneously predicts the gain/phase imbalance and DC offset, and compensates the digital pre-distorted output signal for three types of error components.

In the case of the technique proposed by James K. Cavers, a digital stage simultaneously predicts three types of error components using a transmission signal and even an envelope detector used for a feedback stage is included in system modeling for a prediction algorithm, thereby increasing algorithm reliability.

However, the structure of FIG. 1 is commercially unfeasible due to its complicated adaptive calculation process, taking into consideration that it is implemented with a fixed point in an actual digital signal processor (DSP). In addition, when a particular test signal is used for error compensation, in order to continuously manage a base station transmitter with an initially compensated value or in order for an algorithm to adapt itself to a change in external conditions, it is necessary to interrupt transmission for a predetermined time. For this, a user should perform correction on a trial-and-error basis, or should turn on a computer and perform correction based on predetermined values, preventing preferable management of a base station.

In addition to the error compensation technique illustrated in FIG. 1, there are various other techniques according to a technique of using a signal fed back from the high-power amplifier 170 for a prediction algorithm, compensation order of defects, use of a particular test signal rather than a transmission signal, and compensation at an analog stage.

However, even when an AQM error is compensated for using a feedback signal from the high-power amplifier, it is necessary to include a correct power amplifier model in system modeling for an algorithm, causing an increase in hardware complexity.

In addition, because the algorithm needs exact parameters such as a gain and a DC offset of the envelope detector, it is difficult to implement a substantial adaptive algorithm. Also, performing compensation through independent processes on a one-by-one basis and performing compensation at an analog stage in order to compensate for three types of errors are not suitable for a stable and efficient system integration for the algorithm.

SUMMARY OF THE INVENTION

It is, therefore, an object of the present invention to provide an apparatus and method for securing high-performance digital predistortion by predicting and compensating for an error component using a transmission signal in a base station transmitter of a mobile communication system.

It is another object of the present invention to provide an apparatus and method for commercially realizing continuous and automatic compensation caused by a change in an external environment for an analog quadrature modulation error component.

It is further another object of the present invention to provide an apparatus and method for reducing management cost, size and design complexity for compensating for an analog quadrature modulation error.

To achieve the above and other objects, there is provided an apparatus for compensating for an analog quadrature modulation (AQM) error in a linearization apparatus for AQM-modulating a digital predistorted signal and outputting the AQM-modulated signal through a high-power amplifier. The apparatus comprises a gain/phase error estimator for predicting a gain/phase imbalance error caused by AQM on the predistorted signal; a Direct Current (DC) offset estimator for predicting a DC offset for a feedback signal from the high-power amplifier; and an error compensator for compensating for the digital predistorted signal for a DC offset signal output from the DC offset estimator, and then compensating for a gain/phase error output from the gain/phase error estimator.

To achieve the above and other objects, there is provided a method for compensating for an analog quadrature modulation (AQM) error in a linearization apparatus for AQM-modulating a digital predistorted signal and outputting the AQM-modulated signal through a high-power amplifier. The method comprises predicting a Direct Current (DC) offset for a feedback signal from the high-power amplifier; compensating for the digital predistorted signal for the predicted DC offset; predicting a gain/phase imbalance error caused by AQM on the predistorted signal; and compensating for the digital predistorted signal for the gain/phase imbalance error.

BRIEF DESCRIPTION OF THE DRAWINGS

The above and other objects, features and advantages of the present invention will become more apparent from the following detailed description when taken in conjunction with the accompanying drawings in which.

Throughout the drawings, it should be noted that the same or similar elements are denoted by like reference numerals.

DETAILED DESCRIPTION OF THE EXEMPLARY EMBODIMENT

An embodiment of the present invention will now be described in detail with reference to the accompanying drawings. In the following description, a detailed description of known functions and configurations incorporated herein has been omitted for conciseness.

This embodiment of the present invention provides a technique for reducing the complexity of an adaptive algorithm by predicting and compensating for a gain/phase imbalance after predicting and compensating for a Direct Current (DC) offset, thereby enabling implementation of analog quadrature modulation compensation in an actual system, and for allowing a digital predistortion unit to realize various functions.

Figure 1:
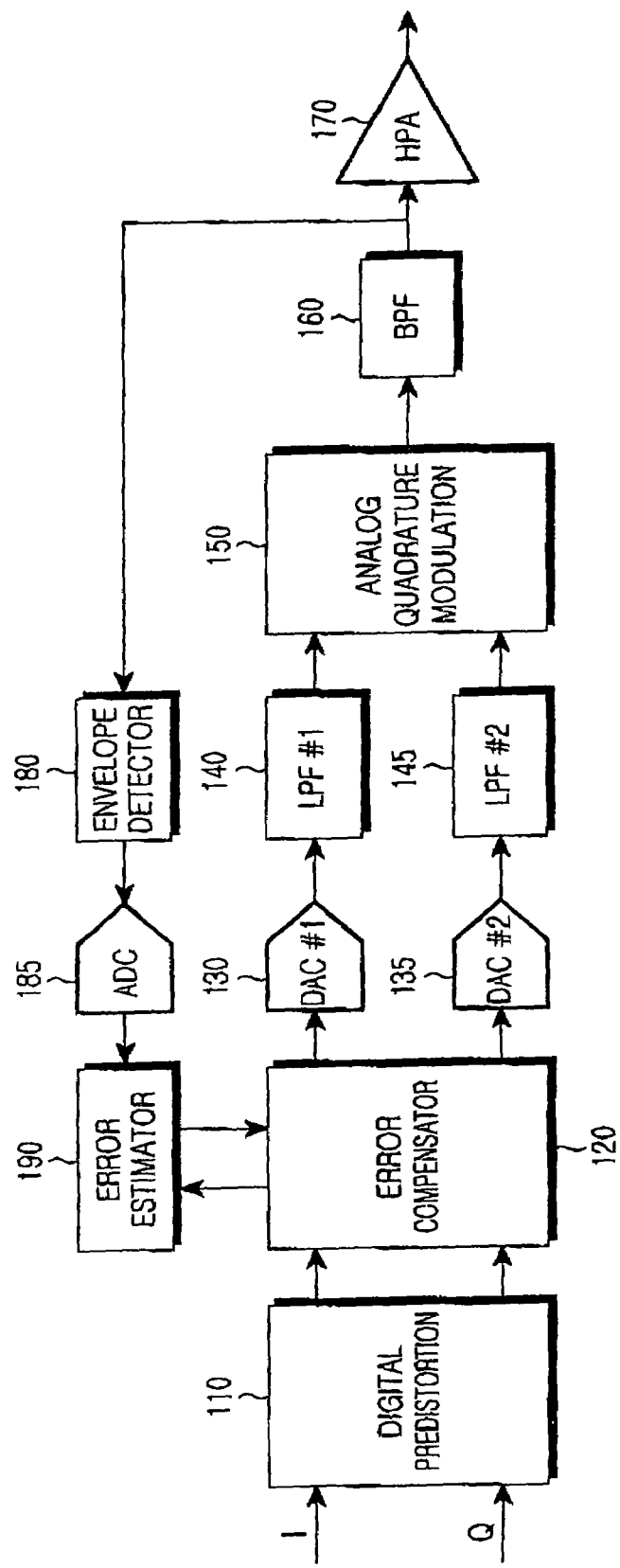
FIG. 1 is a block diagram illustrating a conventional analog quadrature modulation (AQM) error compensation apparatus according to the prior art.
Figure 2:
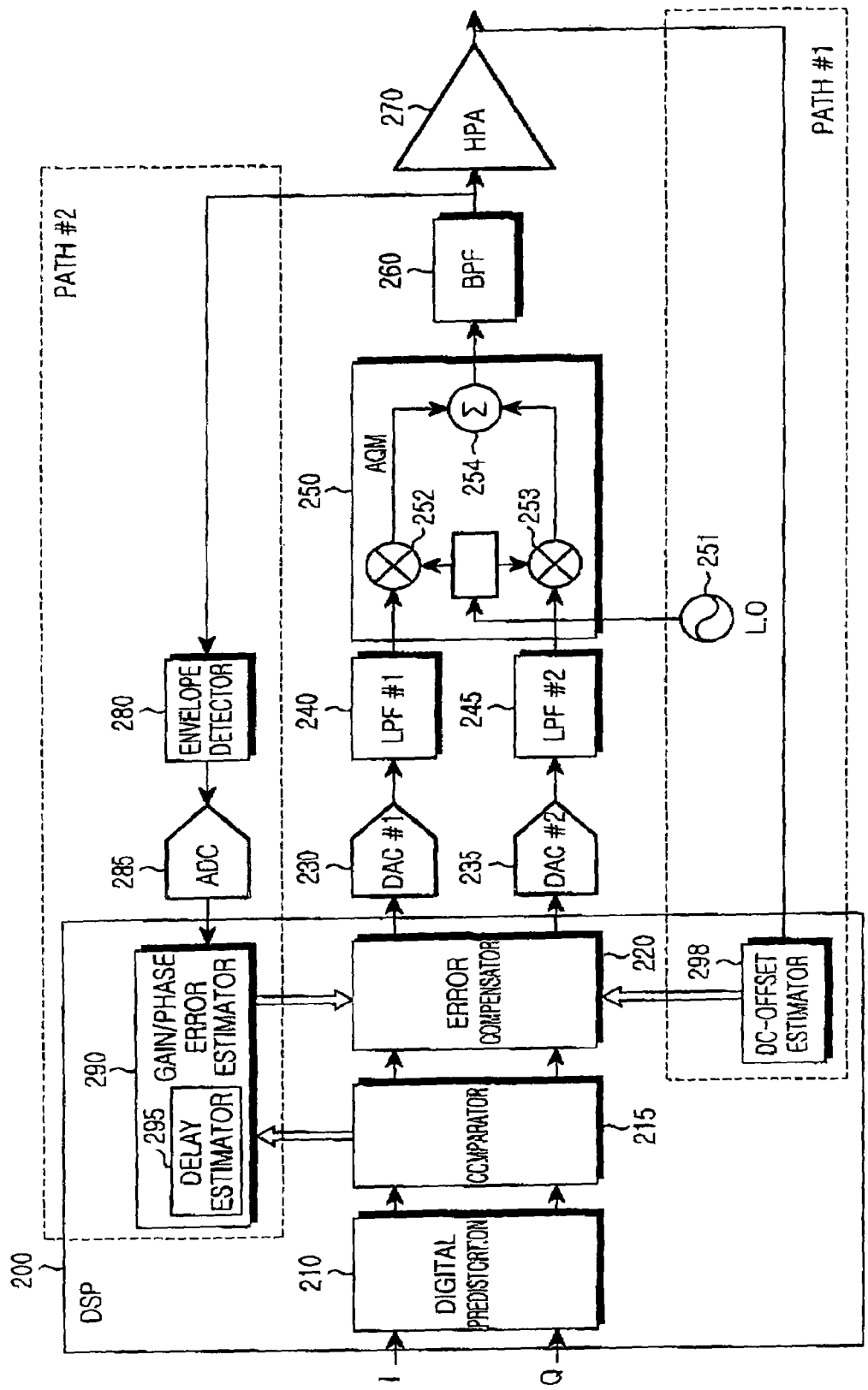
FIG. 2 is a block diagram illustrating an AQM error compensation apparatus according to an embodiment of the present invention.

With reference to FIG. 2, a description will now be made of a transmission system in which a digital predistortion algorithm according to an embodiment of the present invention is implemented.

Referring to FIG. 2, the transmission system includes a digital predistortion (DPD) unit 210, a comparator 215, an error compensator 220, first and second digital-to-analog converters (DACs) 230 and 235, first and second low-pass filters (LPFs) 240 and 245, an analog quadrature modulation (AQM) unit 250, a band-pass filter 260, a high-power amplifier (HPA) 270, an envelope detector 280, an analog-to-digital converter (ADC) 285, a gain/phase error estimator 290, a delay estimator 295, and a DC-offset estimator 298. The digital predistortion unit 210 predistorts an input signal such that it has a characteristic opposite to a non-linear distortion characteristic of a digital input signal. The comparator 215 determines samples necessary for a gain/phase error compensation algorithm for the output signal of the digital predistortion unit 210, and outputs the samples to the gain/phase error estimator 290. The error compensator 220 receives digital I/Q signals output from the digital predistortion unit 210 via the comparator 215, and compensates for AQM error signals in the received digital I/Q signals. The first and second digital-to-analog converters 230 and 235 convert the digital I/Q signals from the error compensator 220 into analog I/Q signals, respectively. The first and second low-pass filters 240 and 245 low-pass-filter the analog I/Q signals output from the first and second digital-to-analog converters 230 and 235, respectively.

The analog quadrature modulation unit 250 modulates the analog I/Q signals output from the first and second low-pass filters 240 and 245 with a carrier frequency. The band-pass filter 160 band-pass-filters the output signals of the analog quadrature modulation unit 250. The high-power amplifier 270 amplifies a signal output from the band-pass filter 260. The envelope detector 280 is located in a second feedback path of the signal output from the band-pass filter 260. The analog-to-digital converter 285 digitally-converts the analog signal from the analog quadrature modulation unit 250, output from the envelope detector 280, and outputs sample values. The gain/phase error estimator 290 extracts a gain/phase imbalance of the samples output from the analog-to-digital converter 285 using reference I/Q signals received from the predistortion unit 210, and applies the extracted gain/phase imbalance to the error compensator 220. The DC-offset estimator 298 predicts an offset for a first feedback path signal output from the high-power amplifier 270.

The analog quadrature modulation unit 250 comprises a first multiplier 252, a second multiplier 253, and a summer 254. The first multiplier 252 multiplies a baseband I-signal output from the first low-pass filter 240 by a local oscillation frequency signal output from a local oscillator (LO) 251. The second multiplier 253 multiplies a baseband Q-signal output from the second low-pass filter 245 by a 90°-phase-shifted local oscillation frequency signal. The summer 254 sums up the output signals of the first and second multipliers 252 and 253, and outputs a radio frequency (RF) signal.

The gain/phase error estimator 290 includes a delay estimator 295 for synchronizing the signal on the second feedback path with the signal output from the comparator 215, for gain/phase compensation.

Now, operations of the elements comprising the system will be described herein below.

The digital predistortion unit 210 adjusts a level of a digital input signal, and predistorts the level-adjusted digital input signal such that it has a characteristic opposite to a non-linear distortion characteristic of the high-power amplifier 270. The error compensator 220 error-compensates the predistorted digital I/Q signals, and applies the error-compensated digital I/Q signals to the first and second digital-to-analog converts 230 and 235.

The first digital-to-analog converter 230 converts the digital I-signal into an analog I-signal, and applies the analog I-signal to the first low-pass filter 240. The second digital-to-analog converter 235 converts the digital Q-signal into an analog Q-signal, and applies the analog Q-signal to the second low-pass filter 245.

The first low-pass filter 240 low-pass-filters the analog I-signal output from the first digital-to-analog converter 230, and outputs the low-pass-filtered analog I-signal to the first multiplier 252 of the analog quadrature modulation unit 250. The second low-pass filter 245 low-pass-filters the analog Q-signal output from the second digital-to-analog converter 235, and outputs the low-pass-filtered analog Q-signal to the second multiplier 253 of the analog quadrature modulation unit 250.

In this manner, the analog quadrature modulation unit 250 performs analog quadrature modulation (AQM) on the analog I/Q signals output from the first and second low-pass filters 240 and 245, and outputs a carrier frequency signal. That is, in the analog quadrature modulation unit 250, the first multiplier 252 frequency-up-converts the baseband I-signal output from the first low-pass filter 240 by multiplying the baseband I-signal by the local oscillation frequency output from the local oscillator 251, and applies the frequency-up-converted I-signal to the summer 254. Similarly, the second multiplier 253 frequency-up-converts the baseband Q-signal output from the second low-pass filter 245 by multiplying the baseband Q-signal by the 90°-phase-shifted local oscillation frequency, and applies the frequency-up-converted Q-signal to the summer 254. The summer 254 sums up the output signals of the first and second multipliers 252 and 253, and outputs a corresponding RF signal to the high-power amplifier 270.

The comparator 215 selectively passes the I/Q signals, or samples a signal satisfying a predetermined condition. A detailed description of the comparator 215, the gain/phase error estimator 290, and the DC-offset estimator 298 will be made below together with a description of an error compensation method.

An AQM error compensation method in the system described above will be described with reference to FIG. 3.

The error compensation method according to an embodiment of the present invention is roughly divided into two processes—a DC offset compensation process and a gain/phase error compensation process. The reason for first performing DC offset compensation is because in predicting a gain/phase error, an error compensator 220 assumes a DC offset to be '0'.

Figure 3:
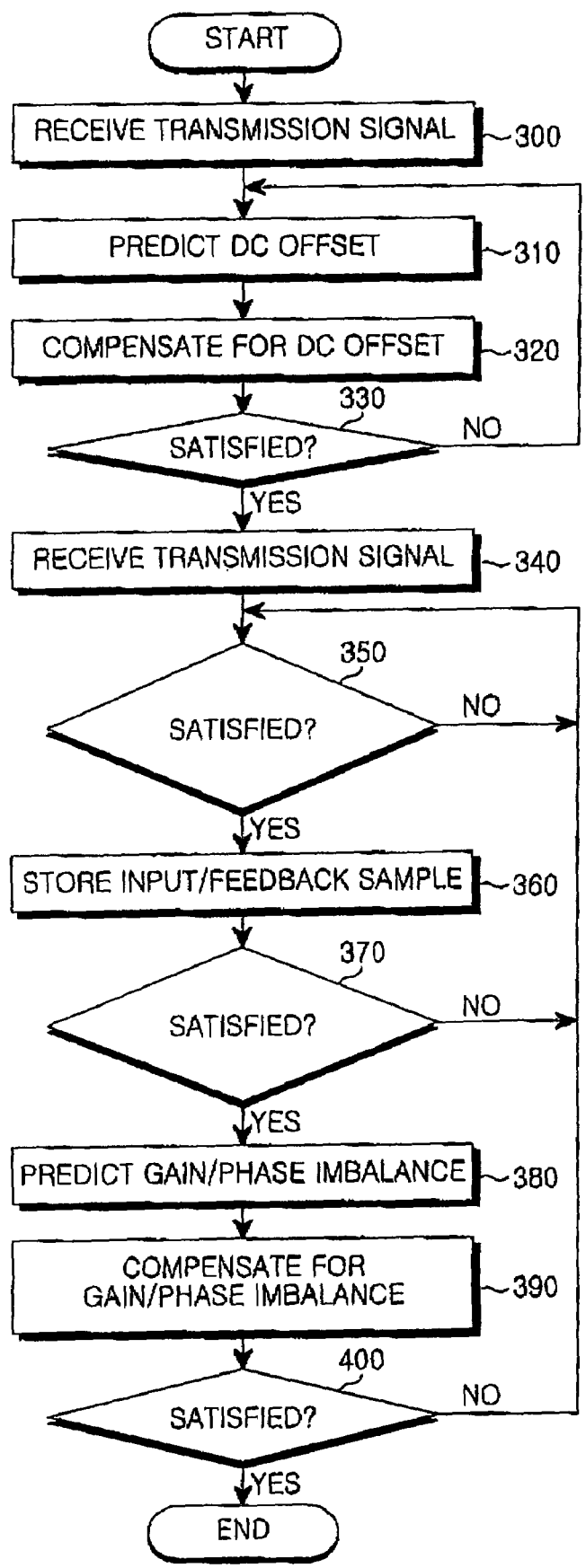
FIG. 3 is a flowchart illustrating an AQM error compensation method according to an embodiment of the present invention.

Referring to FIG. 3, operations of steps 300 to 330 are performed only on a first path which is a transmission path of a feedback signal from a high-power amplifier 270, in order to predict a DC offset. At this point, a comparator 215 serves to simply pass a signal. In step 300, a DC-offset estimator 298 calculates an average of input I/Q samples in a specific frame fed back from the high-power amplifier 270. In step 310, the DC-offset estimator 298 predicts I/Q DC offsets using the I/Q samples, and outputs the predicted I/Q DC offsets to an error compensator 220. In step 320, the error compensator 220 compensates for the DC offsets by inverting signs of the I/Q DC offsets received in step 310 and adding the inverted I/Q DC offsets to the I/Q signals output from a digital predistortion unit 210 via the comparator 215. In step 330, the error compensator 220 determines whether a predetermined number of DC offset compensations is satisfied. Based on the determination result, the steps 310 and 320 are repeatedly performed to insure reliability of the DC offset compensation.

Steps 340 to 400 correspond to the gain/phase error estimation process, and a second path and the comparator 215 are used in the steps. To predict the total gain/phase imbalance, N (experimentally 70 to 110) samples are needed. Therefore, if a transmission signal is received in step 340, the comparator 215 determines in step 350 whether a condition of Equation (1) below is satisfied, for gain/phase imbalance prediction.

$$P_{AQM_{avg}}-\Delta \leq v_I^2+v_Q^2 \leq P_{AQM_{avg}}+\Delta \tag{1}$$

In Equation (1), $P_{AQM_{avg}}$ denotes average output power of an analog quadrature modulation unit or average input power of a high-power amplifier, and $v_I$ and $v_Q$ denote I/Q output signals of a digital predistortion (DPD) unit. That is, power of the signal received from the digital predistortion unit 210 should fall within a predetermined range on the basis of input power of the high-power amplifier.

If it is determined in step 350 that the transmission signal satisfies Equation (1), the comparator 215 outputs the DPD output samples $v_I$ and $v_Q$ to a gain/phase error estimator 290 and the error compensator 220. However, if the transmission signal does not satisfy Equation (1), the comparator 215 outputs the DPD output signals $v_I$ and $v_Q$ only to the error compensator 220. That is, in any case, the error compensator 220 is continuously provided with the DPD output signals $v_I$ and $v_Q$, allowing the digital predistortion algorithm to operate normally.

Also, an input signal fed back through the second path is input to the gain/phase error estimator 290. A delay occurring in an analog-to-digital converter 285 is compensated for by a delay estimator 295 in order to synchronize the output signal of the digital predistortion unit 210 with the feedback signal.

Therefore, in step 360, the gain/phase error estimator 290 synchronizes the input signals satisfying Equation (1) with the input signals fed back from the band-pass filter 260 via the second path using the delay estimator 295 before storing the input signals.

In step 370, the gain/phase error estimator 290 determines whether the number of samples of the stored input signals and feedback input signals satisfies a predetermined number N necessary for execution of a prediction algorithm. If it is determined in step 370 that the number of the stored input/feedback samples is not N, the gain/phase error estimator 290 returns to step 350.

However, if it is determined in step 370 that the number of the stored input/feedback samples is N, the gain/phase error estimator 290 proceeds to step 380 where it performs a prediction algorithm described with reference to Equation (2) to Equation (13) below thereby predicting a gain/phase error.

If the predetermined number of samples are received, a digital signal processor performs a first prediction algorithm on the received samples, and sends the predicted gain/phase imbalance value to an analog quadrature modulation unit to compensate for an AQM error. That is, in FIG. 2, the comparator 215 sends N signals falling within a range determined by Equation (1) to the gain/phase error estimator 290, and performs the prediction algorithm on feedback values $m_i$ corresponding to the signals $v_{d1_i}$ and $v_{d2_i}$.

For accuracy of a prediction model, modeling for an envelope detector on the second path is also included to predict even these parameters, thereby increasing reliability of predicted values. A measured feedback signal is defined as $$m = gXq + gV_d + dI + n \quad (2)$$

where 'g' denotes a gain of an envelope detector, 'd' denotes a bias of the envelope detector, and 'n' denotes a quantization noise of an analog-to-digital converter.

The $V_d$ denotes a level of an input signal, and is defined as $$V_d = [V_{d_1} V_{d_2} \ldots V_{d_{N-1}} V_{d_N}]^T \quad (3)$$

In Equation (3), $V_{d_i}$ denotes a level of an $i^{th}$ input signal, and is defined as $$V_{d_i} = \sqrt{v^2_{d1_i} + v^2_{d2_i}} \quad (4)$$

In Equation (2), 'q' denotes a gain/phase imbalance, and is defined as $$q = [\epsilon \Phi]^T \quad (5)$$

where $\epsilon$ denotes a gain imbalance and $\phi$ denotes a phase imbalance.

In Equation (2), X is defined as $$X = \begin{bmatrix} \frac{v^2_{d1_1} + v^2_{d2_1}}{2V_{d_1}} & \frac{v_{d1_1} v_{d2_1}}{V_{d_1}} \\ \vdots & \vdots \\ \frac{v^2_{d1_i} + v^2_{d2_i}}{2V_{d_i}} & \frac{v_{d1_i} v_{d2_i}}{V_{d_i}} \\ \vdots & \vdots \\ \frac{v^2_{d1_N} + v^2_{d2_N}}{2V_{d_N}} & \frac{v_{d1_N} v_{d2_N}}{V_{d_N}} \end{bmatrix} \quad (6)$$

In Equation (2), 'I' is defined as $$I = [I \ldots I]^T (N'I) \quad (7)$$

The sum of squares of differences between estimation values and prediction values for predicting new parameters can be expressed as $$E = (m - \hat{g}X\hat{q} - \hat{g}V_d - \hat{d}I)^T (m - \hat{g}X\hat{q} - \hat{g}V_d - \hat{d}I) \quad (8)$$

In Equation (8), $\hat{q}$, $\hat{g}$ and $\hat{d}$ for minimizing a value of E are calculated. That is, a condition for setting a gradient of E to '0' is determined for each of $\hat{q}$, $\hat{g}$ and $\hat{d}$, and a desired total error $\hat{q}$ is calculated by solving a simultaneous equation composed of Equation (9) and Equation (10) for the determined condition.

$$\hat{q} = (X^T X)^{-1} \left( \frac{1}{\hat{g}} X^T m - X^T V_d - \frac{1}{\hat{g}} \hat{d} X^T I \right) \quad (9)$$

$$\hat{g} V_d^T Q V_d + \hat{d} V_d^T Q I = V_d^T Q m$$

$$\hat{g} I^T Q V_d + \hat{d} I^T Q I = I^T Q m \quad (10)$$

In Equation (10), Q can be calculated by $$Q = I - X(X^T X)^{-1} X^T \quad (11)$$

The gain/phase error estimator 290 calculates $\hat{g}$ and $\hat{d}$ for Equation (10), and substitutes the $\hat{g}$ and $\hat{d}$ into Equation (9) and calculates $\hat{q}$ at a $k^{th}$ iteration state. In this way, the gain/phase error estimator 290 calculates $q_c$ at a $(k+1)^{th}$ iteration state.

That is, $q_c$ at a $(k+1)^{th}$ iteration state is calculated using Equation (12) below.

$$q_c(k+I) = q_c(k) - \hat{q}(k) \quad (12)$$

Therefore, the total error of the system is calculated by $$q(k+I) = q_c(k+I) + q_p = q(k) - \hat{q}(k) \quad (13)$$

It can be understood that an AQM error can be essentially removed according to the predicted total error q.

Turning back to FIG. 3, the gain/phase error estimator 290 sends the predicted gain/phase imbalance value to the error compensator 220. Then, in step 390, the error compensator 220 performs error compensation.

In step 400, the error compensator 220 determines whether a cost function of Equation (14) is satisfied, such as determines whether a predicted value converges into a predetermined value. The error compensator 220 repeatedly performs steps 350 to 400 until Equation (14) is satisfied.

$$\frac{\varepsilon^2 + \phi^2}{4} \leq \text{fixed value } (10^{-6} \sim 10^{-8}) \quad (14)$$

Even after completely compensating for the AQM error, the AQM compensator measures a cost function of Equation (14) at stated intervals, thereby automatically compensating for defects according to a variation in system environment.

Figure 4:
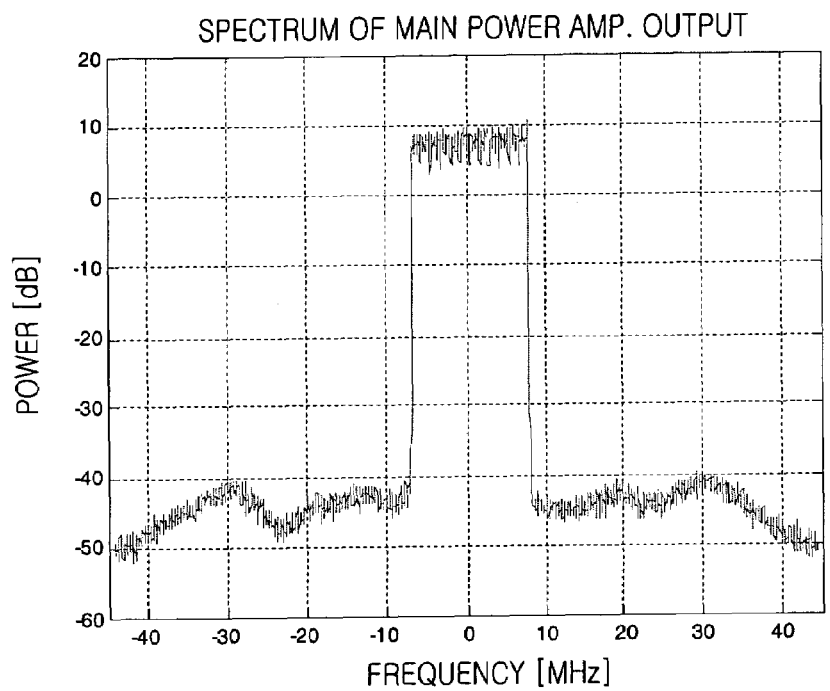
FIG. 4 is a diagram illustrating an output spectrum of a power amplifier during a digital predistortion operation in an ideal AQM state.
Figure 5:
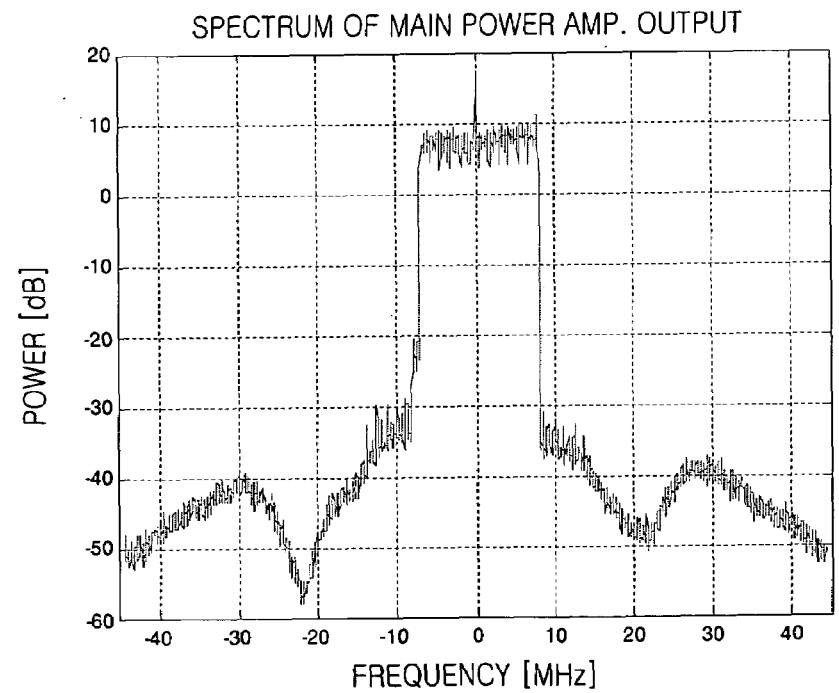
FIG. 5 is a diagram illustrating an output spectrum of a power amplifier during a digital predistortion operation in an AQM state according to the prior art.
Figure 6:
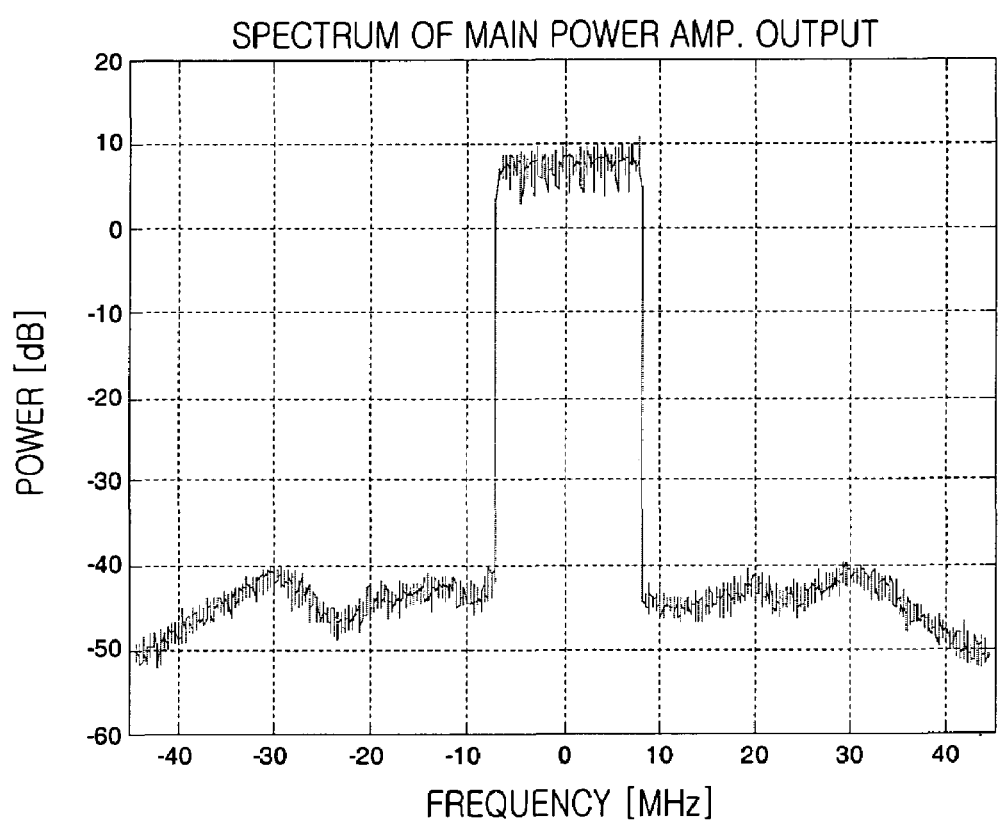
FIG. 6 is a diagram illustrating an output spectrum of a power amplifier during a digital predistortion operation by an AQM error compensation apparatus and method according to an embodiment of the present invention.

FIG. 4 is a diagram illustrating an output spectrum of a power amplifier during a digital predistortion operation in an ideal AQM state. FIG. 5 is a diagram illustrating an output spectrum of a power amplifier during a digital predistortion operation in an AQM state according to the prior art. Compared with FIG. 4, FIG. 5 shows that many errors occur. FIG. 6 is a diagram illustrating an output spectrum of a power amplifier during a digital predistortion operation by an AQM error compensation apparatus and method according to an embodiment of the present invention. Compared with FIG. 4, FIG. 6 shows almost the same output spectrum.

As can be understood from the foregoing description, because the digital predistortion algorithm can be implemented with minimum complexity in a digital signal processor, it is possible to secure performance of the base station ttransmitter and reduce the production cost and the management cost.

While the invention has been shown and described with reference to a certain preferred embodiment thereof, it should be understood by those skilled in the art that various changes in form and details may be made therein without departing from the spirit and scope of the invention as defined by the appended claims.

What is claimed is:

1. An apparatus for compensating for an analog quadrature modulation (AQM) error in a linearization apparatus for AQM-modulating a digital predistorted signal and outputting the AQM-modulated signal through a high-power amplifier, the apparatus comprising:
   a gain/phase error estimator for predicting a gain/phase imbalance error caused by AQM on the predistorted signal;
   a Direct Current (DC) offset estimator for predicting a DC offset from a feedback signal output from the high-power amplifier; and
   an error compensator for compensating for the digital predistorted signal for a DC offset signal output from the DC offset estimator, and then compensating for a gain/phase error output from the gain/phase error estimator.

2. The apparatus of claim 1, wherein the DC offset estimator predicts a DC offset by calculating an average of the high-power-amplified feedback signals for a predetermined time.

3. The apparatus of claim 1, wherein the error compensator repeats the DC offset compensation a predetermined number of times.

4. The apparatus of claim 1, wherein the error compensator determines a DC offset as '0' in predicting a gain/phase error.

5. The apparatus of claim 1, wherein the gain/phase error estimator includes a delay estimator for synchronizing the predistorted signal with an AQM feedback signal of the predistorted signal.

6. The apparatus of claim 1, further comprising a comparator for determining a sample for gain/phase error compensation among the digital predistorted signals.

7. The apparatus of claim 6, wherein the comparator determines a predistorted signal having a power level within a predetermined range as a sample on the basis of average output power of the AQM signal.

8. The apparatus of claim 7, wherein the comparator outputs the digital predistorted output sample only to the error compensator when the predistorted signal does not fall within the predetermined range.

9. The apparatus of claim 6, wherein the gain/phase error estimator includes a delay estimator for synchronizing a sample output from the comparator with an AQM feedback sample.

10. The apparatus of claim 9, wherein the gain/phase error estimator acquires a predetermined number of predistorted output samples.

11. The apparatus of claim 1, wherein the error compensator performs gain/phase prediction until the gain/phase error converges into a predetermined value.

12. A method for compensating for an analog quadrature modulation (AQM) error in a linearization apparatus for AQM-modulating a digital predistorted signal and outputting the AQM-modulated signal through a high-power amplifier, the method comprising the steps of:
   predicting a Direct Current (DC) offset from a feedback signal output from the high-power amplifier;
   compensating for the digital predistorted signal for the predicted DC offset;
   predicting a gain/phase imbalance error caused by AQM on the predistorted signal; and compensating for the digital predistorted signal for the gain/phase imbalance error.

13. The method of claim 12, wherein the step of predicting a DC offset comprises the step of predicting a DC offset by calculating an average of the high-power-amplified feedback signals for a predetermined time.

14. The method of claim 12, wherein the step of compensating for the DC offset comprises the step of repeating DC offset compensation a predetermined number of times.

15. The method of claim 12, wherein the step of compensating for a gain/phase error comprises the step of determining a DC offset as '0' in predicting a gain/phase error.

16. The method of claim 15, wherein the step of predicting a gain/phase error comprises the step of synchronizing the determined sample with an AQM feedback sample.

17. The method of claim 16, wherein the step of predicting a gain/phase error comprises the step of acquiring a predetermined number of predistorted output samples.

18. The method of claim 12, further comprising the step of determining a sample for gain/phase error compensation among the digital predistorted signals.

19. The method of claim 18, wherein the step of determining a sample for error compensation comprises the step of determining a predistorted signal having a power level within a predetermined range as a sample on the basis of average output power of the AQM signal.

20. The method of claim 12, wherein the error compensation step comprises the step of performing gain/phase prediction until the gain/phase error converges into a predetermined value.

* * * * *